United States Patent
Chang et al.

(10) Patent No.: US 9,210,824 B2
(45) Date of Patent: Dec. 8, 2015

(54) SUPPORT DEVICE AND ELECTRICAL CONNECTOR ASSEMBLY USED THEREOF

(71) Applicant: HON HAI PRECISION INDUSTRY CO., LTD., New Taipei (TW)

(72) Inventors: Chun-Yi Chang, New Taipei (TW); Yuan-Chieh Lin, Lake Forest, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 87 days.

(21) Appl. No.: 14/073,827

(22) Filed: Nov. 6, 2013

(65) Prior Publication Data

US 2015/0126060 A1    May 7, 2015

(51) Int. Cl.
 *H05K 7/10* (2006.01)
 *H01R 12/70* (2011.01)
 *H01R 12/72* (2011.01)

(52) U.S. Cl.
 CPC ............ *H05K 7/10* (2013.01); *H01R 12/7076* (2013.01); *H01R 12/728* (2013.01)

(58) Field of Classification Search
 USPC ........... 439/527, 159, 532, 630, 326; 361/754
 See application file for complete search history.

(56) References Cited

U.S. PATENT DOCUMENTS

| | | | |
|---|---|---|---|
| 6,368,153 B1* | 4/2002 | Hwang | 439/607.2 |
| 6,822,872 B2* | 11/2004 | Schulz et al. | 361/747 |
| 6,881,095 B2* | 4/2005 | Murr et al. | 439/607.2 |
| 6,893,294 B2* | 5/2005 | Moriyama et al. | 439/607.2 |
| 7,044,763 B1* | 5/2006 | Inoue et al. | 439/326 |
| 7,204,710 B1* | 4/2007 | Sato et al. | 439/326 |
| 7,226,314 B2* | 6/2007 | Lang et al. | 439/607.04 |
| 7,448,912 B1* | 11/2008 | Shiue et al. | 439/630 |
| 7,465,197 B1* | 12/2008 | Wu et al. | 439/630 |
| 7,727,018 B2* | 6/2010 | Bright et al. | 439/607.28 |
| 7,845,975 B2* | 12/2010 | Cheng et al. | 439/541.5 |
| 8,075,199 B2* | 12/2011 | Losio et al. | 385/92 |
| 8,202,103 B2* | 6/2012 | Zhou et al. | 439/159 |
| 8,668,518 B2* | 3/2014 | Wu | 439/532 |
| 8,760,870 B2* | 6/2014 | Yamamoto | 361/710 |
| 8,767,381 B2* | 7/2014 | Shukla et al. | 361/679.01 |
| 2005/0101170 A1* | 5/2005 | Tanaka et al. | 439/159 |
| 2005/0208805 A1* | 9/2005 | Kodera et al. | 439/159 |
| 2012/0195013 A1* | 8/2012 | Trzaskos et al. | 361/754 |

FOREIGN PATENT DOCUMENTS

TW    M450103    4/2013

* cited by examiner

*Primary Examiner* — Alexander Gilman
(74) *Attorney, Agent, or Firm* — Wei Te Chung; Ming Chieh Chang

(57) ABSTRACT

An electrical connector assembly (100) for electrically connecting an abutment connector (3) comprises an electrical connector (1) with a plurality of contacts (12) and a support device, the support device includes a support member (2) for positioning the abutment connector (3) being assembled in a horizontal direction and a press member (4) assembled to the support member (2), the support member (2) includes a bottom wall (22) and a top wall (21) opposite to each other, the bottom wall (22) includes a spring portion (221) supports the abutment connector (3) to make it disconnect with the contacts (12), when the press member (4) is inserted into the support member (2), the spring portion (221) moves downwardly to make the abutment connector (3) connect with the contacts (12).

20 Claims, 5 Drawing Sheets

SUPPORT DEVICE AND ELECTRICAL CONNECTOR ASSEMBLY USED THEREOF

BACKGROUND OF THE INVENTION

1. Field of the Invention

The present invention relates to a support device and electrical connector assembly for connecting with an IC package, and more particularly to a support device with improved structure to establish robust electrical connection between the electrical connector assembly and the IC package. This instant application relates to a copending application with a title of "LOW INSERTION FORCE PLUGGABLE CONNECTOR SYSTEM WITH RELEASE MECHANISM" filed on Nov. 5, 2013 and having the same assignee with the instant application.

2. Description of Related Art

TW patent No. M450103 issued to Chang on Apr. 1, 2013 discloses a conventional electrical connector for electrically connecting an IC package with a substrate. The electrical connector includes an insulative housing, a plurality of electrical contacts received in the insulative housing, a cover plate and a spacer. The cover plate includes a main portion located on the insulative housing. The main portion includes a recess in the bottom surface. The recess connects with the outside space through a long hole. The spacer goes through the long hole into the recess to press the IC package, which ensures a robust electrical connection between the electrical connector and the IC package. Due to the IC package has connected with the electrical contacts before the spacer being assembled to recess of the cover plate, the IC package can only be assembled to the electrical connector from an up to down direction. If assemble the IC package from a horizontal direction, the contacts will be damaged.

Hence, it is desirable to provide an improved electrical connector to overcome the aforementioned disadvantages.

SUMMARY OF THE INVENTION

Accordingly, an object of the present invention is to provide a support device and electrical connector assembly with improved structure to make the IC package to be assembled form a horizontal direction.

According to one aspect of the present invention, An electrical connector assembly mounted on a substrate for electrically connecting an abutment connector or pluggable module, comprises an electrical connector and a support device, the electrical connector includes a plurality of contacts, the support device includes a support member for positioning the abutment connector being assembled in a horizontal direction and a press member assembled to the support member, the support member including a bottom wall and a top wall opposite to the bottom wall, the bottom wall includes a spring portion, when the abutment connector is assembled to the support member, the spring portion supports the abutment connector to make the abutment connector disconnect with the contacts, when the press member is inserted into the support member, the spring portion moves downwardly to make the abutment connector connect with the contacts.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
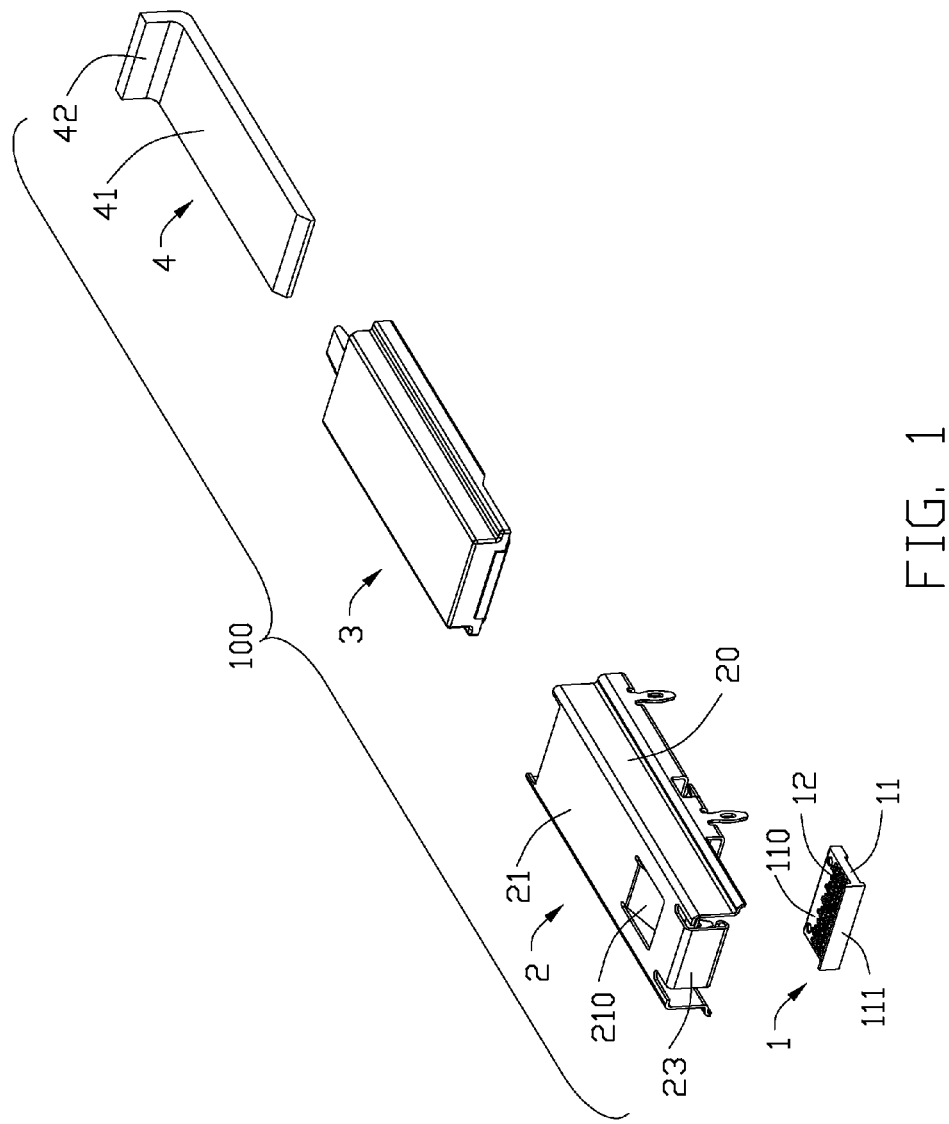
FIG. 1 is an exploded view of an electrical connector assembly according to a preferred embodiment of the present invention.
Figure 2:
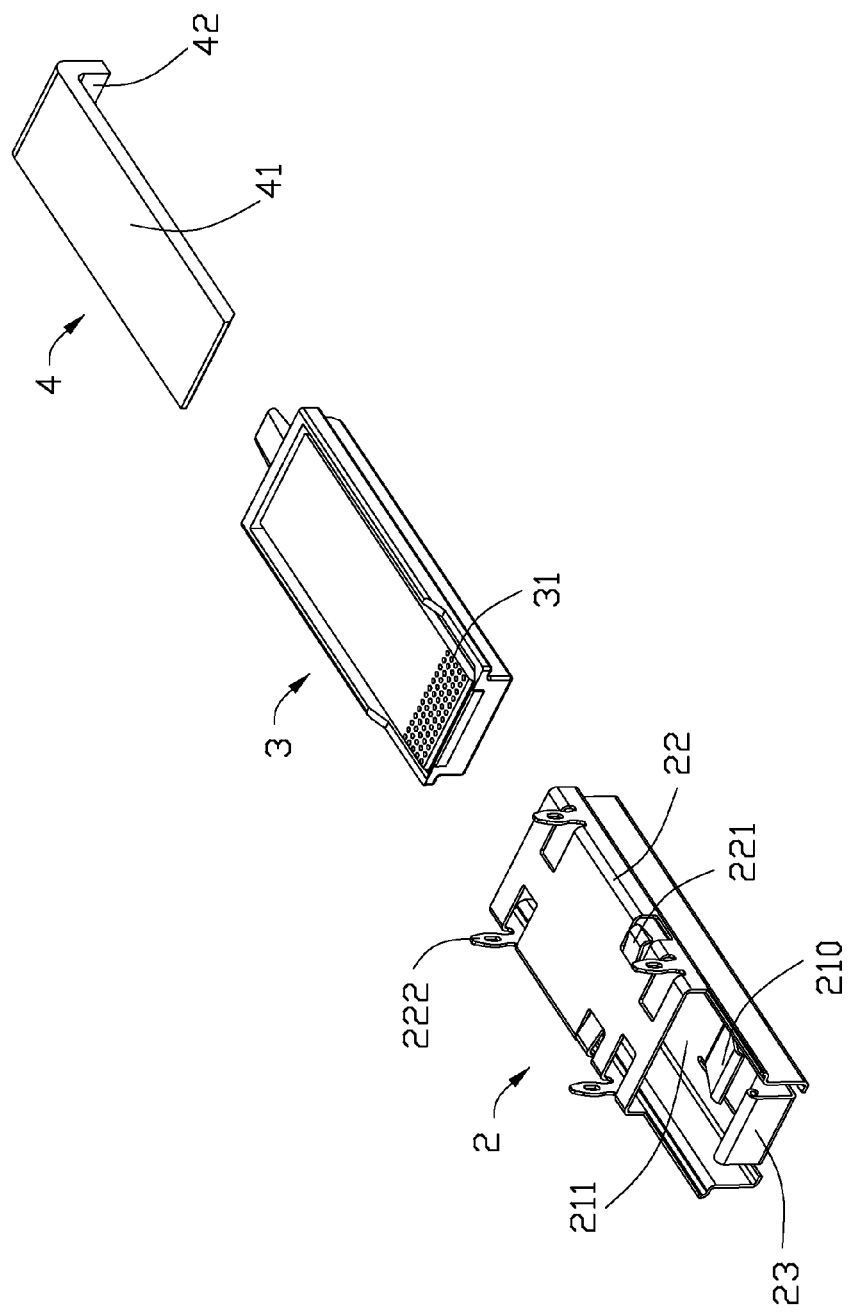
FIG. 2 is an exploded view of the support device and the other connector assembled thereon.
Figure 3:
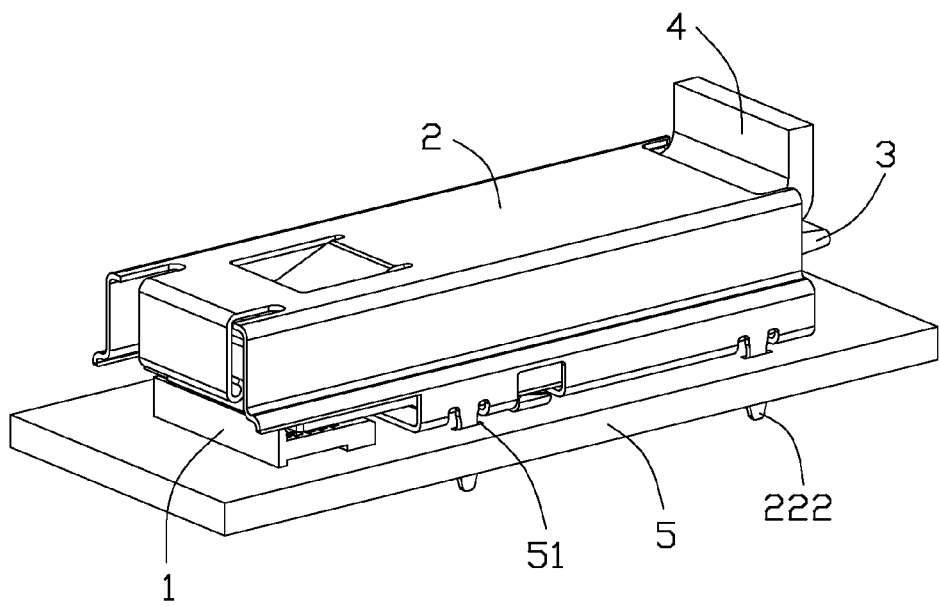
FIG. 3 is an assembled view of the electrical connector assembly with a substrate.

FIGS. 1 to 3 illustrates an electrical connector assembly 100 in accordance to a preferred embodiment of the present invention, the electrical connector assembly 100 is used for electrically connecting an abutment connector or pluggable module 3 to a substrate 5. The electrical connector assembly 100 comprises an electrical connector 1 assembled to the substrate 5 and a support device (not labeled). The abutment connector 3 defines a plurality of pads 31.

Figure 4:
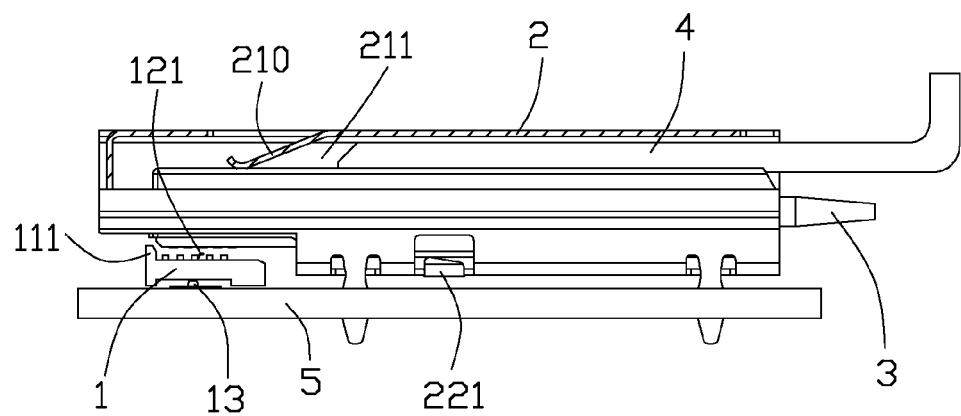
FIG. 4 is a cross-sectional view of the electrical connector assembly, showing the press member in a first position.

Referring to FIG. 1, the electrical connector 1 includes an insulative housing 11 and a plurality of contacts 12 received therein. The insulative housing 11 includes a body portion 110 and a stop wall 111 extending upwardly from one end of the body portion 110. When the abutment connector 3 is assembled to the abutment connector 3, the abutment connector 3 restricts by the stop wall 111 to ensure the abutment connector 3 be assembled in a correct position. The contacts 12 are received in the body portion 110 of the insulative housing 11. Referring to FIG. 4, each of the contacts 12 includes a contact portion 121 extending beyond the body portion 110 of the insulative housing 11. The contact portions 121 are used for connecting with the pads 31 of the abutment connector 3.

Referring to FIGS. 1 to 3, the support device includes a support member 2 be assembled to the substrate 5 and a press member 4 assembled to the support member 2. The support member 2 is used to receive and position the abutment connector 3. The press member 4 is used to press the abutment connector 3. The support member 2 is made of metal material and includes a bottom wall 22 adjacent to the substrate 5, a top wall 21 opposite to the bottom wall 22 and a pair of opposite sidewalls 20 connecting the top wall 21 and the bottom wall 22. The top wall 21, the bottom wall 22 and the pair of sidewalls 20 form a space 211 for receiving the abutment connector 3. The bottom wall 22 includes a spring portion 221 to support the abutment connector 3 and a foot portion 222 extending downwardly to position the support member 2 on the substrate 5. The top wall 21 includes a press portion 210 for pressing the press member 4 and a stop portion 23 extending downwardly. When the abutment connector 3 is assembled to the electrical connector 3, the abutment connector 3 restricts by the stop portion 23 to ensure the abutment connector 3 be assembled in a correct position. The press member 4 includes a base portion 41 for pressing the abutment connector 3 and a handing portion 42 extending from the base portion 41.

Referring to FIGS. 3 to 4, showing the electrical connect assembly 100 is assembled to the substrate 5. The contacts 12 of the electrical connector 1 are soldered to the substrate 5 through soldering materials 13. The foot portion 222 of the support member 2 is inserted into the hole 51 of the substrate 5 to position the support member 2 on the substrate 5. The electrical connector 1 locates on one side of the bottom wall 22. In this embodiment, the top wall 21 is longer than the bottom wall 22, and the electrical connector 1 locates under the top wall 21.

Figure 5:
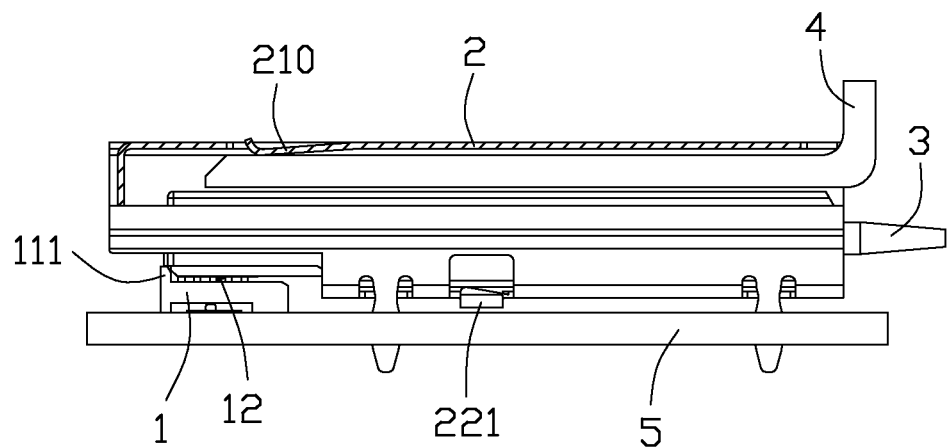
FIG. 5 is similar to FIG. 4, showing the press member in a second position.

Referring to FIGS. 4 to 5, showing the electrical connector assembly 100 is used. Firstly, the abutment connector 3 is pushed into the space 211 of the support member 2 in a horizontal direction, due to the abutment connector 3 being supported by the spring portion 221 of the support member 2, the pads 31 of the abutment connector 3 disconnect with the contacts 12 of the electrical connector 1, thus can protect the contacts 12 from being damaged. Secondly, the press member 4 is inserted into the space 211 of the support member 2 in a horizontal direction. The press member 4 locates on the abutment connector 3 and press the abutment connector 3. When the press member 4 is inserted into the space 211 of the support member 2, the press portion 210 of the support member 2 presses the press member 4 to make the abutment connector 3 move downwardly and the spring portion 221 of the support member 2 also moves downwardly, thus the pads 31 of the abutment connector 3 connect with the contact portions 121 of the contacts 12.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical connector assembly mounted on a substrate for electrically connecting an abutment connector, comprising:
    an electrical connector including a plurality of contacts; and
    a support device including a support member for positioning the abutment connector being assembled in a horizontal direction and a press member assembled to the support member, the support member including a bottom wall and a top wall opposite to the bottom wall; wherein
    the bottom wall includes a spring portion, and when the abutment connector is assembled to the support member, the spring portion supports the abutment connector to make the abutment connector disconnect from the contacts, and when the press member is inserted into the support member, the spring portion moves downwardly to make the abutment connector connect with the contacts.

2. The electrical connector assembly as claimed in claim 1, wherein the top wall includes a press portion extending toward the bottom wall for pressing the press member.

3. The electrical connector as claimed in claim 2, wherein the support member further includes a pair of opposite sidewalls connecting the top wall and the bottom wall, the top wall, the bottom wall and the pair of sidewalls form a space for receiving the abutment connector.

4. The electrical connector as claimed in claim 2, wherein the top wall further includes a stop portion extending downwardly to block the abutment connector.

5. The electrical connector as claimed in claim 1, wherein the press member is inserted into the support member in the horizontal direction.

6. The electrical connector as claimed in claim 1, wherein the electrical connector further includes an insulative housing with a body portion for receiving the contacts, each of the contacts including a contact portion extending beyond the body portion to contact with the abutment connector.

7. The electrical connector as claimed in claim 6, wherein the insulative housing further includes a stop wall extending upwardly from one end of the body portion to block the abutment connector.

8. The electrical connector as claimed in claim 1, wherein the top wall is longer than the bottom wall, the electrical connector locates under the top wall and locates on one side of the bottom wall.

9. The electrical connector as claimed in claim 8, wherein the press member including a base portion for pressing the abutment connector and a handing portion extending upwardly from the base portion.

10. A support device mounted on a substrate for positioning an abutment connector, comprising:
    a support member for positioning the abutment connector being assembled in a horizontal direction; and
    a press member assembled to the support member, the support member including a bottom wall and a top wall opposite to the bottom wall; wherein
    the bottom wall includes a spring portion, and when the abutment is assembled to the support member, the spring portion supports the abutment connector to make the abutment connector disconnect from the contacts, and when the press member is inserted into the support member, the spring portion is deflected to move downwardly to make the abutment connector connect with the contacts.

11. The support device as claimed in claim 10, wherein the top wall includes a press portion extending toward the bottom wall for pressing the press member.

12. The support device as claimed in claim 11, wherein the support member further includes a pair of opposite sidewalls connecting the top wall and the bottom wall, the top wall, the bottom wall and the pair of sidewalls form a space for receiving the abutment connector.

13. The support device as claimed in claim 11, wherein the top wall further includes a stop portion extending downwardly to block the abutment connector.

14. The support device as claimed in claim 10, wherein the press member is inserted into the support member in the horizontal direction.

15. An electrical connector assembly comprising:
    a printed circuit board;
    an electrical connector mounted upon the printed circuit board;
    a support member mounted upon the printed circuit board with a receiving space therebetween and covering said electrical connector, said receiving space forwardly communicating with an exterior via a front opening of said support device;
    an upward biasing device located in the receiving space around the printed circuit board;
    a pluggable module inserted into the receiving space via the front opening in a suspension manner not to connect the electrical connector due to upward support provided by the upward biasing device; and
    a press member successively actuated to invade the receiving space with an extent to have the upward biasing device downwardly oppressed and have the pluggable module downwardly pressed upon the electrical connector so as to have the pluggable module mechanically and electrically connect the electrical connector.

16. The electrical connector assembly as claimed in claim 15, wherein said supporting member defines a pressing portion around a top wall thereof to downward press the press member.

17. The electrical connector assembly as claimed in claim 15, wherein said press member directly downwardly presses upon the pluggable module.

18. The electrical connector assembly as claimed in claim 15, wherein the electrical connector defines a plurality of upward conductors, and the pluggable connector defines a plurality of downward conductors for electrical connection with said upward conductors once the press member is actuated.

19. The electrical connector assembly as claimed in claim 15, wherein said press member is discrete and completely removable from the support member.

20. The electrical connector assembly as claimed in claim 19, wherein said press member is moveable relative to the support member along a front-to-back direction.

* * * * *